United States Patent
Ito et al.

[11] Patent Number: 6,080,522
[45] Date of Patent: Jun. 27, 2000

[54] RADIATION-SENSITIVE RESIST COMPOSITION WITH HIGH HEAT RESISTANCE

[75] Inventors: Hiromi Ito, Tokyo; Hatsuyuki Tanaka, Shizuoka, both of Japan

[73] Assignee: Clariant Internaitonal, Ltd., Muttenz, Switzerland

[21] Appl. No.: 09/242,942

[22] PCT Filed: Jun. 18, 1998

[86] PCT No.: PCT/JP98/02707

§ 371 Date: Feb. 26, 1999

§ 102(e) Date: Feb. 26, 1999

[87] PCT Pub. No.: WO99/00704

PCT Pub. Date: Jan. 7, 1999

[30] Foreign Application Priority Data

Jun. 30, 1998 [JP] Japan .................................. 9/174578

[51] Int. Cl.[7] ...................................................... G03F 7/023
[52] U.S. Cl. ........................ 430/192; 430/165; 430/193; 528/148; 528/153
[58] Field of Search .................................. 430/192, 193, 430/165; 528/148, 153

[56] References Cited

U.S. PATENT DOCUMENTS 5,275,910  1/1994  Moriuma et al. ..................... 430/191
5,576,138 11/1996  Ando et al. .......................... 430/191
5,677,103 10/1997  Kim et al. ............................ 430/191
5,798,422  8/1998  Karasawa et al. ..................... 525/450
6,013,407  1/2000  Kawata et al. ....................... 430/191

FOREIGN PATENT DOCUMENTS 1045880  2/1998  Japan .

OTHER PUBLICATIONS

Derwent Patent Family Report and/or Abstract.
Derwent Abstract JP 5127374 (See A Above).
Derwent Abstract JP 8165335 (See D Above).
Derwent Abstract JP 9090624.

*Primary Examiner*—John S. Chu
*Attorney, Agent, or Firm*—Scott E. Hanf

[57] ABSTRACT

A radiation sensitive resist composition with high sensitivity, capable of forming a highly heat-resistant resist pattern. The radiation-sensitive resist composition contains, together with a resist material, a polymer which is obtained by reacting (a) a xylylene compound, (b) salicylic acid and (c) 9,9'-bis(hydroxyphenyl)fluorene derivatives or diol compounds of 3,3,3',3'-tetramethyl-2,3,2',3'-tetrahydro-(1,1')-spirobiindene, and which has a weight average molecular weight of 1,000 to 5,000 and Tg of 100 to 150° C. Examples of (c) include 9,9'-bis(4-hydroxyphenyl)fluorene and 3,3,3',3'-tetramethyl-2,3,2',3'-tetrahydro-(1,1')-spirobiindene-6,6'-diol. As the resist material, any of positive- and negative-working resists may be used, with that comprising an alkali-soluble resin and a quinonediazide photo-sensitizer being preferably used.

6 Claims, No Drawings

RADIATION-SENSITIVE RESIST COMPOSITION WITH HIGH HEAT RESISTANCE

TECHNICAL FIELD

This invention relates to a radiation sensitive resist composition responding to radiation such as ultraviolet rays, deep ultraviolet rays, X-rays, electron beams, etc. and, more particularly, to a radiation sensitive resist composition capable of forming a highly heat-resistant resist pattern with high sensitivity and high resolution.

BACKGROUND ART

In manufacturing integrated circuits, color filters, liquid crystal display elements, etc., finely patterning technology has been required and, in order to satisfy the requirement, there have been used radiation sensitive resist compositions capable of forming a pattern with high resolution. Formation of such fine pattern using the radiation sensitive resist composition is conducted, for example, in the following manner. A radiation sensitive resist composition is coated on a substrate such as a silicon substrate by a well-known or known coating method such as a spin coating method, roller coating method or the like, prebaked to form a radiation sensitive resist layer on the substrate, then patternwise exposed through a mask using radiation such as ultraviolet rays, deep ultraviolet rays, X-rays, electron beams or the like or directly beam-exposed without using a mask to thereby form a patternwise latent image in the resist layer, followed by post baking for improving developability, etching resistance, etc. and subsequent development processing. The thus formed resist pattern is subjected to optional post steps such as a dry etching step, a diffusing step, etc. As the resist to be used in this finely patterning technology, there have been known various positive- or negative-working ones.

Typical examples of conventionally known positive- or negative-working resists are illustrated below. As the positive-working resists, there are illustrated resists comprising an alkali-soluble resin and a quinonediazide photo-sensitizer and chemically amplified resists and, as the negative-working resists, there are illustrated polyvinyl cinnamate, an aromatic azide compound, a resist comprising a cyclized rubber and a bisazide compound, a diazo resin, a photopolymerizable composition containing an addition polymerizable unsaturated compound, a chemically amplified negative-working resist comprising an alkali soluble resin, a cross-linking agent and an acid generator, and the like. For example, in the above-described positive-working resist comprising an alkali soluble resin and a quinonediazide photo-sensitizer, a novolak resin not containing low molecular weight portion is preferably used as the alkali soluble resin from the resolution point of view. The resist containing such novolak resin, however, has the defect of insufficient sensitivity. Therefore, it is popularly conducted to add a sensitizer to a resist composition to improve sensitivity. This sensitizer is generally a low molecular weight phenol compound, and does not contribute to increasing heat resistance of the resist due to its low molecular weight. Therefore, when the resist is subjected to a high temperature processing step such as a post exposure baking step (PEB) or a dry etching step at a temperature of about 120 to 140° C., deformation of the resist pattern takes place or the pattern edge portion becomes round to form a semi-cylindrical shape due to its low heat resistance. This phenomenon such as pattern deformation is observed seriously in a pattern portion where a large area is left as such. The reason for deformation of pattern in the pattern portion where a large area is left as such is generally explained as follows. That is, when a resist is prebaked, a solvent in the resist is removed by the prebaking heat. However, since drying of the resist proceeds from the resist surface, the interior of the resist is liable to contain a larger amount of the residual solvent. Then, the prebaked resist is made selectively soluble in a developer by irradiation with radiation. A resist pattern having a small area comparatively difficultly suffers from deformation of pattern dimension since it is supported by the surface of the resist pattern even when the interior of the resist shows some fluidity. However, with a resist pattern having a large area , the resist surface showing only a slight fluidity fails to support the pattern dimension when the interior of the resist shows some fluidity upon being heated, thus deformation of the pattern taking place. This problem of insufficient heat resistance arises not only with the novolak resin from which a low molecular portion has been fractionated but with novolak resins from which the low molecular portion has not been fractionated or other conventionally known resist materials. Deformation of a resist pattern or formation of a semicylindrical pattern in the high temperature processing would make it difficult to form a pattern with a desired width or resolution by etching, that is, control of dimension would become difficult. Thus, in order to render the resist pattern more heat resistant, so-called UV curing has been conducted in which a high energy radiation such as radiation with deep UV rays or radiation with UV rays in vacuo is conducted to thereby make the resist highly polymerized with the least loss of transmitted energy, thus imparting a high heat resistance. In the conventional art, however, the above problem has not still been fully solved.

Therefore, an object of the present invention is to provide a radiation sensitive resist composition not having the problem with conventional compositions and capable of forming a pattern with high sensitivity and high resolution and high heat resistance.

DISCLOSURE OF THE INVENTION

The above-described object of the present invention is attained by incorporating, in a conventionally well known or known radiation sensitive resist composition containing a resist material and an organic solvent, a polymer having a weight-average molecular weight of 1,000–5,000 and a glass transition point (Tg) of 100–150° C. which is prepared by reacting (a) a xylylene compound represented by the general formula:

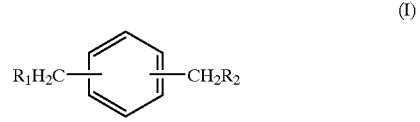

(I)

wherein $R_1$ and $R_2$ may be the same or different and independently represent a halogen atom, a hydroxyl group or an alkoxyl group containing 1 to 4 carbon atoms;

(b) salicylic acid; and (c) a dihydroxy compound represented by the general formula:

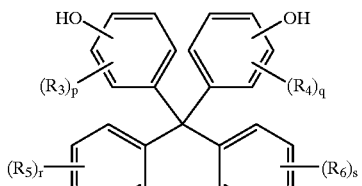

and/or general formula (III):

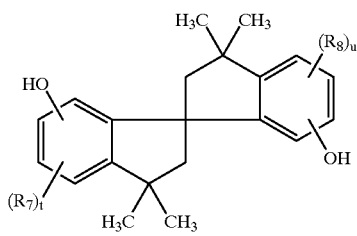

wherein $R_3$, $R_4$, $R_5$, $R_6$, $R_7$ and $R_8$ may be the same or different and independently represent an alkyl group, an alkoxyl group, a nitro group or a halogen atom, p and q are independently 0 or an integer of 1 to 3, r and s are independently 0 or an integer of 1 to 4, and t and u are independently 0, 1 or 2.

The polymer obtained by the above-described reaction is considered to include a polymer having within the molecule the recurring unit represented by the following general formula (IV) and/or (V):

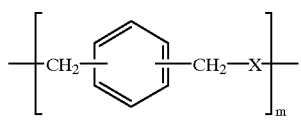

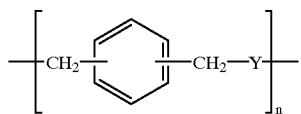

wherein X represents group;

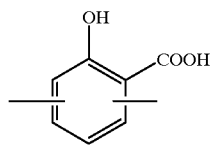

represents group;

(II)

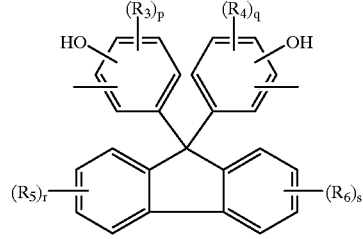

or group;

(3)

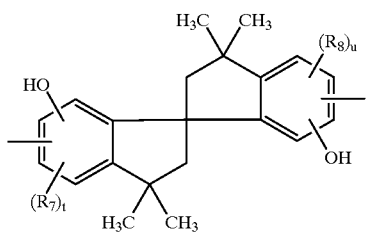

wherein $R_3$, $R_4$, $R_5$, $R_6$, $R_7$ and $R_8$ are the same as defined above, m and n are independently an integer of 1 or more, p and q are independently 0 or an integer of 1 to 3, r and s are independently 0 or an integer of 1 to 4, and t and u are independently 0, 1 or 2.

As polymers having within the molecule the above-described recurring units (IV) and (V), there are considered, for example, those represented by the following general formula (VI):

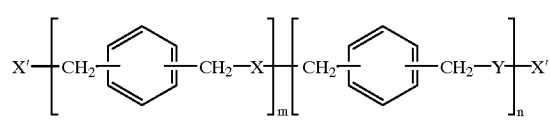

wherein X and Y. are the same as defined above, and X' represents group;

(4)

OH
COOH

As is described above, the polymer to be used in the present invention is a polymer obtained by reacting a xylylene compound represented by the general formula (I), salicylic acid, and a dihydroxy compound represented by the general formula (II) and/or (III) and, as preferable xylylene compounds represented by the general formula (I), there are illustrated, for example, α,α'-dichloro-p-xylene, α, α'-dibromo-p-xylene, α, α'-diiodo-p-xylene, α,α'-dihydroxy-p-xylene, α,α'-dimethoxy-p-xylene, α, α'-diethoxy-p-xylene, α, α'-di-n-propoxy-p-xylene, α, α'-diisopropoxy-p-xylene, α, α'-di-n-butoxy-p-xylene, α, α'-di-sec-butoxy-p-xylene, α, α'-diisobutoxy-p-xylene, etc.

Of the groups represented by $R_3$, $R_4$, $R_5$, $R_6$, $R_7$ and $R_8$ of the dihydroxy compound represented by the general formula (II) or (III), the alkyl group is preferably exemplified by an alkyl group containing 1 to 10 carbon atoms, the alkoxyl group is preferably exemplified by an alkoxyl group containing 1 to 10 carbon atoms, and p, q, r, s, t and u are preferably 0 or 1.

Preferable examples of the compound represented by the general formula (II) are illustrated below;
1) 9,9'-bis-(4-hydroxyphenyl)fluorene,
2) 9,9'-bis-(4-hydroxyphenyl)-3-methyl-fluorene,
3) 9,9'-bis-(4-hydroxyphenyl)-3-ethoxy-fluorene,
4) 9,9'-bis-(4-hydroxyphenyl)-3-chloro-fluorene, and
5) 9,9'-bis-(2-hydroxyphenyl)fluorene.

Preferable examples of the compound represented by the general formula (III) are illustrated below;
1) 3,3,3',3'-tetramethyl-2,3,2',3'-tetrahydro-(1,1')-spirobiindene-6,6'-diol,
2) 3,3,3',3',4,4'-hexamethyl-2,3,2',3'-tetrahydro-(1,1')-spirobiindene-6,6'-diol,
3) 3,3,3',3',5,5'-hexamethyl-2,3,2',3'-tetrahydro-(1,1')-spirobiindene-6,6'-diol,
4) 5,5'-diethyl-3,3,3',3'-tetramethyl-2,3,2',3'-tetrahydro-(1,1')-spirobiindene-6,6'-diol,
5) 5,5'-diisopropyl-3,3,3',3'-tetramethyl-2,3,2',3'-tetrahydro-(1,1')-spirobiindene-6,6'-diol,
6) 7,7'-diethyl-3,3,3',3'-tetramethyl-2,3,2',3'-tetrahydro-(1,1')-spirobiindene-6,6'-diol,
7) 5,5'-diethoxy-3,3,3',3'-tetramethyl-2,3,2',3'-tetrahydro-(1,1')-spirobiindene-6,6'-diol,
9) 5,5'-dichloro-3,3,3',3'-tetramethyl-2,3,2',3'-tetrahydro-(1,1')-spirobiindene-6,6'-diol,
10) 3,3,3',3'-tetramethyl-2,3,2',3'-tetrahydro-(1,1')-spirobiindene-5,5'-diol, and
11) 7,7'-dichloro-3,3,3',3'-tetramethyl-2,3,2',3'-tetrahydro-(1,1')-spirobiindene-5,5'-diol.

Additionally, the above-described compounds are given only for exemplifying the compounds represented by the general formula (I), (II) or (III), and the xylylene compounds and the dihydroxy compounds are not limited to these illustrated specific compounds. The xylylene compound and the dihydroxy compounds may be used independently or in combination of two or more.

The reaction is conducted by using preferably 1 to 5 mols in total, more preferably 1.1 to 3 mols, of salicylic acid and the dihydroxy compound represented by the general formula (II) and/or (III) per mol of the xylylene compound represented by the general formula (I) in the presence of an acid catalyst under heating provided that salicylic acid is used in an amount of 1 to 8 mols per mol of the dihydroxy compounds. The reaction temperature is 110° C. or above, usually 120 to 250° C. for completing the reaction in a short time, more preferably 130 to 180° C. The reaction time is about 1 to 30 hours. As the acid catalyst, there may be used inorganic or organic acids, for example, mineral acids such as hydrochloric acid, sulfuric acid, phosphoric acid, etc.; organic sulfonic acids such as methanesulfonic acid, p-toluenesulfonic acid, etc.; Friedel-Crafts type catalysts such as zinc chloride, aluminum chloride, stannic chloride, ferric chloride, etc.; sulfuric esters such as dimethyl sulfate, diethyl sulfate, etc.; ultrastrong acids such as trifluoromethanesulfonic acid, boron trifluoride, etc.; or the like independently or in combination. The amount of the catalyst to be used may be about 0.0001 to about 10% by weight, preferably 0.001 to 1% by weight, based on the total amount of charged starting materials. The polymer of the present invention may also be prepared by the process of using a solvent which can dissolve each of the compounds and is inert to the reaction as well as the above-described process.

As to the manner of conducting the reaction, any manner may be selected such as a manner of charging the whole materials in a lump to react or a manner of adding the xylylene compound to a mixture of the dihydroxy compound, etc. and the catalyst to react successively. Alcohols or the like to be generated with the progress of the reaction are trapped and removed out of the system. After completion of the reaction, volatile ingredients were removed, and the reaction product was discharged and cooled to obtain a solid and fragile polymer. Alternatively, vacuum distillation or extraction with an alkaline aqueous solution, washing with water or other procedure may be conducted before discharge of the polymer to thereby remove unreacted dihydroxy compounds.

In the manner as is described above, a polymer having a weight average molecular weight of 1,000 to 5,000 and a Tg of 100 to 150° C. may be obtained. However, if the weight average molecular weight of the polymer is less than 1,000, it scarcely contributes to improve heat resistance of the polymer due to the low molecular weight component and, if the weight average Of the polymer is more than 5,000, there may result in difficulty of polymerization reaction or detrimental influences on the properties of resist coating such as poor solubility into resist, which may be attributed to possible steric hindrance structure of the dihydroxy compounds.

The polymers having a weight average molecular weight of 1,000 to 5,000 show a Tg of 100 to 150° C. with the increase in molecular weight.

In the polymers, the molar ratio of salicylic acid to the dihydroxy compound is preferably from 60/40 to 98/2.

These polymers are used in an amount of 0.1 to 40 parts by weight, preferably 0.5 to 30 parts by weight, based on 100 partsrsey weight of solid components in the resist material. Additionally, in the case of using as a resist material which comprises a quinonediazide photo-sensitizer and an alkali-soluble resin, the polymer is used in an amount of preferably 1 to 30 parts by weight, more preferably 5 to 20 parts by weight, based on 100 parts by weight of the alkali-soluble resin.

As the resist material in the resist composition of the present invention, any of conventionally known positive- or negative-working resists may be used. As the positive-working resists, preference is given to those which comprise an alkali soluble resin and a quinonediazide photo-sensitizer and chemically amplified resists. As the positive-working resists comprising an alkali soluble resin and a quinonediazide photo-sensitizer, there have conventionally been known various ones, and any of them may be used in the present invention with no limitations.

To illustrate the quinonediazide photo-sensitizer to be used in the positive-working resist comprising the alkali soluble resin and the quinonediazide photo-sensitizer, there are for example, 1,2-benzoquinonediazido-4-sulfonic acid, 1,2-naphthoquinonediazido-4-sulfonic acid, 1,2-naphthoquinonediazido-5-sulfonic acid, esters or amides of these sulfonic acids, etc. The ester or amide compounds of the sulfonic acids may be obtained by the condensation reaction between a particular quinonediazidosulfonic acid or quinonediazidosulfonyl chloride and a compound having a hydroxyl group or groups or a compound having an amino group or groups. As the compound having a hydroxyl group or groups, there are illustrated dihydroxybenzophenone, trihydroxybenzophenone, tetrahydroxybenzophenone, phenol, naphthol, p-methoxyphenol, bisphenol A, pyrocatechol, pyrogallol, pyrogallol methyl ether, gallic acid, α,α', α"-tris(4-hydroxyphenyl)-1,3,5-triisopropylbenzene, tris(hydroxyphenyl)methane, etc. and, as the compound having an amino group or groups, there are illustrated aniline, p-aminodiphenylamine, etc. These quinonediazide photo-sensitizer may be used alone or in combination of two or more.

On the other hand, as the alkali soluble resins, there are illustrated, for example, novolak resin, polyvinyl phenol, polyvinyl alcohol, polymers of acrylic acid or methacrylic acid, etc. As the novolak resin, there are illustrated, for example, polycondensation products between one or more phenols such as phenol, o-cresol, m-cresol, p-cresol, xylenol, trimethylphenol, t-butylphenol, ethylphenol, 2-naphthol, 1,3-dihydroxynaphthalene, etc. and an aldehyde such as formaldehyde, paraformaldehyde or the like. These alkali soluble resins such as the novolak resins may be used in combination of two or more as the case demands or, further, other resins may be added for improving film-forming properties, etc. In addition, as the quinonediazidosulfonic acid esters, there may be used an ester between a polycondensation product between a phenol and an aldehyde or ketone and a quinonediazidosulfonic acid. Of these, novolak resins having a weight average molecular weight of 2,000 to 20,000, more preferably 5,000 to 15,000, and not having low molecular weight portions are preferred.

The ratio of quinonediazide photo-sensitizer to alkali soluble resin varies depending upon the specifically used photo-sensitizer and the alkali soluble resin but, in general, a ratio of 1:1 to 1:20 by weight is preferred, though not limiting the present invention in any way.

The chemically amplified resists are resists which are designed so that, upon irradiation with radiation, an acid is generated in the irradiated area and this acid in turn catalyzes chemical change of the resist to change solubility for a developing solution of the radiation-irradiated area to form a pattern. It contains, for example, an acid-generating compound capable of generating an acid upon being irradiated with radiation and a resin which contains acid-sensitive groups that are decomposed in the presence of an acid to generate alkali soluble groups such as a phenolic hydroxyl group or a carboxyl group.

As the above-described acid-generating compounds capable of generating an acid upon being irradiated with radiation, there are illustrated bissulfonyldiazomethanes such as bis(isopropylsulfonyl)diazomethane; bissulfonylmethanes such as methylsulfonyl p-toluenesulfonylmethane; sulfonylcarbonyl diazomethanes such as cyclohexylsulfonylcyclohexylcarbonyl diazomethane; sulfonylcarbonylalkanes such as 2-methyl-2-(4-methylphenylsulfonyl)propiophenone; nitrobenzylsulfonates such as 2-nitrobenzyl p-toluenesulfonate; alkyl or arylsulfonates such as pyrogalloltrismethanesulfonate; benzoinsulfonates such as benzointosylate; N-sulfonyloxyimides such as N-(trifluoromethylsulfonyloxy)phthalimide; pyrrolidones such as (4-fluorobenzenesulfonyloxy)-3,4,6-trimethyl-2-pyrrolidone; sulfonic esters such as 2,2,2-trifluoro-1-trifluoromethyl-1-(3-vinylphenyl)-ethyl 4-chlorobenzenesulfonate; onium salts such as triphenylsulfonium methanesulfonate; etc. These compounds may be used independently or as a mixture of two or more.

The resin containing acid-sensitive groups which is decomposed in the presence of an acid to form alkali soluble groups such as phenolic hydroxyl group or carboxyl group comprises acid-sensitive group which is decomposed in the presence of an acid and an alkali soluble resin portion having alkali soluble groups. As the acid-sensitive group, there are illustrated 1-substituted ethyl groups such as a l-methoxyethyl group, a 1-benzyloxyethyl group, etc.; 1-branched alkyl groups such as a t-butyl group, etc.; silyl groups such as a trimethylsilyl group, etc.; germyl groups such as a trimethylgermyl group, etc.; alkoxycarbonyl groups such as a t-butoxycarbonyl group, etc.; acyl groups such as an acetyl group, etc.; cyclic acid-decomposable groups such as a tetrahydropyranyl group, a tetrahydrofuranyl group, a tetrahydrothiopyranyl group, a tetrahydrothiofuranyl group, etc.; and the like. Of these acid-decomposable groups, a t-butyl group, a benzyl group, a t-butyoxycarbonyl group, a tetrahydropyranyl group, a tetrahydrofuranyl group, a tetrahydrothiopyranyl group, a tetrahydrothiofuranyl group, etc. are preferred.

As the alkali soluble resins having alkali soluble groups such as phenolic hydroxyl groups or carboxyl groups, there are illustrated, for example, polymers obtained from vinyl monomers such as hydroxystyrene, hydroxy-α-methylstyrene, hydroxymethylstyrene, vinylbenzoic acid, carboxymethylstyrene, carboxymethoxystyrene, acrylic acid, methacrylic acid, crotonic acid, maleic acid, itaconic acid, citraconic acid, mesaconic acid, cinnamic acid, etc., copolymers of at least one of these monomers and other monomer or monomers, and polycondensation resins such as novolak resin.

In addition to the above-described chemically amplified resins, there are known those which contain an alkali soluble resin, an acid generator, and a compound that is to be decomposed in the presence of an acid to reduce the solubility-controlling effect of the alkali soluble resin or increase solubility of the alkali soluble resin, and they can also be used.

The polymer of the present invention may also be used for negative-working resists such as those which contain a high molecular compound having a photo-sensitive group such as polyvinyl cinnamate, those which contain an azide compound such as an aromatic azide compound or a combination of cyclized rubber and a bisazide compound, those which contain a diazo resin, and those which contain a photopolymerizable composition containing an addition polymerizable unsaturated compound.

These resist materials are dissolved in an organic solvent known or well known for resists to prepare a resist composition. As the solvent, a single solvent or a mixture of two or more solvents may be used. Preferable solvents include, for example, propylene glycol monomethyl ether acetate, ethyl lactate, methyl amyl ketone, etc.

Further, conventionally known various additives for resist such as surfactants, sensitizers, etc. may also be compounded in the resist composition of the present invention depending upon the end use.

Formation of a resist pattern using the resist composition of the present invention is specifically conducted, for example, in the following manner.

First, resist materials are dissolved in the above-described organic solvent together with the polymer and, if necessary, insolubles are removed from the solution by filtration to prepare a radiation-sensitive resist composition. The composition is then coated on a substrate such as silicon or glass in a prebaked thickness of, for example, 0.01 to 1,000 μm by a conventionally known coating method such as spin-coating method, roller-coating method, reverse roller-coating method, cast coating method or doctor coating method. The resist composition thus coated on the substrate is then prebaked on, for example, a hot plate to remove the solvent and form a resist layer. The prebaking temperature varies depending upon kind of the solvent or resist used, but is usually about 30 to about 200° C., preferably about 50 to about 150° C.

After formation of the resist layer, exposure is conducted. Since resists to be used have different radiation-sensitive region depending upon kind of the used resist, exposure is conducted using an exposure light source corresponding to the radiation-sensitive region of the resist used. In the exposure, patternwise irradiation with UV rays, deep UV rays, X-rays, electron beams or the like is conducted using an irradiating apparatus such as a high pressure mercury lamp, a metal halide lamp, an ultra-high pressure mercury lamp, a KrF eximer laser, an ArF eximer laser, a soft X-ray irradiating apparatus, an electron beam-drawing apparatus, etc. through, if necessary, a mask.

After the exposure, high temperature processing at about 120 to about 140° C. may be conducted, if desired. Main objects of this high temperature processing are;
1. to remove solvent or water remaining in the resist,
2. to make the coating more dense to thereby improve resistance of the resist in the subsequent steps (e.g., wet etching, dry etching, diffusing step, etc.), and
3. to improve adhesion with the substrate and reduce side etching (undercut) upon wet etching.

After this high temperature processing, development is conducted, which is optionally followed by dry etching. In this dry etching, an antireflective coating or a substrate is etched by using gas plasma or the like. During this dry etching process, heat is generated, and the resist is heated, in some cases, to a temperature of 150° C. or above. It has been reported that pattern dimension is liable to be changed by the stress due to ionized gases or radicals generated upon etching.

In the above-described development of the resist, a water solution or an aqueous solution of an inorganic alkali such as sodium hydroxide, potassium hydroxide, sodium carbonate, sodium silicate, etc.; an amine such as ammonia, ethylamine, diethylamine, triethylamine, diethylethanolamine, triethanolamine, benzylamine, etc.; an amide such as formamide, etc.; a quaternary ammonium salt such as tetramethylammonium hydroxide (TMAH), tetraethylammonium hydroxide, choline, etc.; a cyclic amine such as pyrrole, piperadine, etc.; or the like is usually used. For forming a resist pattern upon manufacturing IC or LSI, an aqueous solution of a metal ion-free organic amine, particularly TMAH or choline, is preferably used.

BEST MODE FOR PRACTICING THE INVENTION

The present invention will now be described in more detail by reference to Synthesis Examples, Examples and Comparative Example, which, however, do not limit the present invention in any way.

First, preparation of the polymer to be used in the radiation sensitive resist composition of the present invention is described by reference to Synthesis Examples.

Synthesis EXAMPLE 1

166 g (1 mol) of α, α'-dimethoxy-p-xylene, 138 g (1 mol) of salicylic acid and 308 g (1 mol) of 3,3,3',3'-tetramethyl-2,3,2',3'-tetrahydro-(1,1')-spirobiindene-6,6'-diol were placed in a reactor and heated to dissolve. 1.0 g of an acid catalyst of methanesulfonic acid was added thereto at an inside temperature of 120° C. under stirring. The temperature was gradually increased and was kept at 160° C. for 8 hours to mature. Methanol generated during the reaction was removed out of the system. After the maturation, volatiles were removed under aspirator-reduced pressure to purify the product. Yield of the thus obtained compound was 350 g. The thus obtained polymer had a Tg of 136° C. and a weight average molecular weight (Mw) of 2,310. Analysis of NMR data revealed that the molar ratio of salicylic acid to 3,3,3', '3'-tetramethyl-2,3,2',3'-tetrahydro-(1,1')-spirobiindene-6,6'-diol was 85:15. $^1$H-NMR (in acetone-$d_6$) relative to TMS standard (400 MHz) showed signals at 1.25 (b,12H) and 3.90 (T,4H).

Synthesis Example 2

166 g (1 mol) of α,α'-dimethoxy-p-xylene, 165 g (1.2 mol) of salicylic acid and 246 g (0.8 mol) of 3,3,3',3'-tetramethyl-2,3,2',3'-tetrahydro-(1,1')-spirobiindene-6,6'-diol were placed in a reactor and heated to dissolve. 1.0 g of an acid catalyst of methanesulfonic acid was added thereto at an inside temperature of 120° C., under stirring. The temperature was gradually increased and was kept at 160° C. for 8 hours to mature. Methanol generated during the reaction was removed out of the system. After the maturation, volatiles were removed under aspirator-reduced pressure to purify the product. Yield of the thus obtained compound was 300 g. The thus obtained polymer had a Tg of 125° C. and a weight average molecular weight (Mw) of 1,170. Analysis of NMR data revealed that the molar ratio of salicylic acid to 3,3,3',3'-tetramethyl-2,3,2',3'-tetrahydro-(1, 1')-spirobiindene-6,6'-diol was 97:3. $^1$H-NMR (in acetone-$d_6$) relative to TMS standard (400 MHz) showed signals at 1.23 (b,12H) and 3.86 (T,4H).

Synthesis Example 3

166 g (1 mol) of α, α'-dimethoxy-p-xylene, 138 g (1 mol) of salicylic acid and 350 g (1 mol) of 9,9'-bis(4-hydroxyphenyl)fluorene were placed in a reactor and heated to dissolve. 1.0 g of an acid catalyst of methanesulfonic acid was added thereto at an inside temperature of 120° C. under stirring. The temperature was gradually increased and was kept at 160° C. for 8 hours to mature. Methanol generated during the reaction was removed out of the system. After the maturation, volatiles were removed under aspirator-reduced pressure to purify the product. Yield of the thus obtained compound was 300 g. The thus obtained polymer had a Tg of 137° C. and a weight average molecular weight (Mw) of 3,280. Analysis of NMR data revealed that the molar ratio of salicylic acid to 9,9'-bis(4-hydroxyphenyl)fluorene was 70:30. $^1$H-NMR (in acetone-$d_6$) relative to TMS standard (400 MHz) showed signals at 3.86 (T,4H) and 7.11 (b,overlapping of 4H and 14H).

Synthesis Example 4

166 g (1 mol) of α, α'-dimethoxy-p-xylene, 165 g (1.2 mol) of salicylic acid and 280 g (0.8 mol) of 9,9'-bis(4-hydroxyphenyl)fluorene were placed in a reactor and heated to dissolve. 1.0 g of an acid catalyst of methanesulfonic acid was added thereto at an inside temperature of 120° C. under stirring. The temperature was gradually increased and was kept at 160° C. for 8 hours to mature. Methanol generated during the reaction was removed out of the system. After the maturation, volatiles were removed under aspirator-reduced pressure to purify the product. Yield of the thus obtained compound was 320 g. The thus obtained polymer had a Tg of 125° C. and a weight average molecular weight (Mw) of 1,230. Analysis of NMR data revealed that the molar ratio of salicylic acid to 9,9'-bis(4-hydroxyphenyl)fluorene was 80:20. $^1$H-NMR (in acetone-$d_6$) relative to TMS standard (400 MHz) showed signals at 3.86 (T,4H) and 7.08 (b,overlapping of 4H and 14H)

Additionally, the weight average molecular weights in respective Examples are those obtained by measuring according to gel permeation chromatography (GPC) under the following conditions using Shodex columns (made by Showa Denko K. K.).

| Flow rate: | 1.0 mL/min |
|---|---|
| Mobile phase | THF(tetrahydrofuran) |
| Column temperature | 40° C. |
| Injection amount | 100 μL |

EXAMPLE 1

84 Parts by weight of the novolak resin described below, 37.5 parts by weight of the quinonediazide photo-sensitizer described below, and 16 parts by weight of the polymer obtained in the Synthesis Example 1 described above were dissolved in ethyl lactate (solvent) to obtain a resist composition. (Novolak resin)

Polycondensation product between m-cresol/p-cresol=60/40 and formaldehyde (low molecular portions having a molecular weight of 300 or less being cut off) (Quinonediazide photo-sensitizer)

Esterified product between 2,3,4,4'-tetrahydroxybenzophenone and 1,2-naphthoquinonediazido-5-sulfonyl chloride This resist composition was coated on a silicon wafer in a prebaked thickness of 1.07 μm (prebaking being conducted at 90° C. for 60 seconds) according to spin coating method. This was exposed using i-line stepper (exposing apparatus: LD-5015; CW), and then developed for 60 seconds according to paddle method in a 2.38 wt % TMAH aqueous solution. The pattern thus obtained was heated for 5 minutes at 100, 110, 120, 130, 140 and 150° C. on a direct hot plate. Pattern forms after the heating were observed under a scanning electron microscope (SEM) to evaluate them according to the following three ranks, thus the results shown in the following table being obtained.

○: Original shape remained.
Δ: Corners began to be rounded.
X: Corners were round off.

EXAMPLE 2

Procedures in Example 1 were repeated except for using the polymer obtained in Synthesis Example 2 in place of that obtained in Example 1 to obtain the results shown in the following Table.

EXAMPLE 3

Procedures in Example 1 were repeated except for using the polymer obtained in Synthesis Example 3 in place of that obtained in Example 1 to obtain the results shown in the following Table.

EXAMPLE 4

Procedures in Example 1 were repeated except for using the polymer obtained in Synthesis Example 4 in place of that obtained in Example 1 to obtain the results shown in the following Table.

Comparative Example

Procedures in Example 1 were repeated except for using TPPA (trisphenol type of compounds made by Honshu Chemical Industry Co., Ltd.) in place of the polymer obtained in Example 1 to obtain the results shown in the following Table.

TABLE

| | Relative Threshold Energy | Heating Temperature (° C.) | | | | | | |
|---|---|---|---|---|---|---|---|---|
| | | Not Heated | 100 | 110 | 120 | 130 | 140 | 150 |
| Example 1 | +10% | ○ | ○ | ○ | ○ | ○ | Δ | Δ ~ x |
| Example 2 | +5% | ○ | ○ | ○ | ○ | ○ | Δ | x |
| Example 3 | +15% | ○ | ○ | ○ | ○ | ○ | Δ | Δ ~ x |
| Example 4 | ±0% | ○ | ○ | ○ | ○ | ○ | Δ | x |
| Comparative Example | 0% | ○ | ○ | ○ | ○ | Δ | x | x |

Additionally, Relative Threshold Energy was calculated as follows. Exposure amounts necessary for completely dissolving away resist coatings coated and developed under the same conditions as in Example 1 with changing exposure amount were determined, and the relative threshold energy was calculated according to the following formula, with exposure amount in Comparative Example being taken as a standard.

Relative Threshold Energy (%)=100-(Exposure amount in Example/Exposure amount in Comparative Example)×100

As is apparent from the above table, the resist compositions containing the polymer of the present invention showed an enhanced heat resistance and an increased sensitivity.

Advantages of the Invention

As has been described in detail hereinbefore, in the present invention, a polymer obtained by reacting a xylylene compound represented by the general formula (I), salicylic acid and a dihydroxy compound represented by the general formula (II) and/or (III) are in corporated in a radiation-sensitive resist composition to enhance heat resistance of the resist coating and reduce pattern deformation of the resist coating in a high-temperature processing step such as PEB step or dry etching step to thereby improve dimension control of resist pattern or etching pattern. In addition, in a resist composition using a quinonediazide photo-sensitizer and a novolak resin, sensitivity is also improved by using the polymer of the present invention, thus both high heat resistance and high sensitivity being attained.

Industrial Applicability

The radiation sensitive resist composition of the present invention is used as a material for forming a resist coating upon manufacturing semiconductor integrated circuit elements or the like.

We claim:

1. A radiation sensitive resist composition containing at least both a resist material and an organic solvent, wherein said composition contains a polymer having a weight-average molecular weight of 1,000–5,000 and a glass transition point (Tg) of 100–150° C. which is prepared by reacting (a) a xylylene compound represented by the general formula:

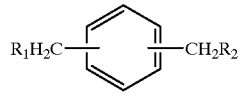
(I)

wherein $R_1$ and $R_2$ may be the same or different and independently represent a halogen atom, a hydroxyl group or an alkoxyl group containing 1 to 4 carbon atoms;

(b) salicylic acid; and (c) a dihydroxy compound represented by the general formula:

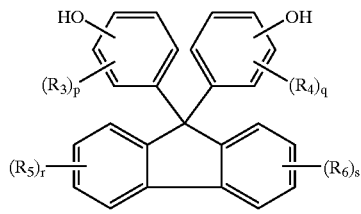
(II)

and/or general formula:

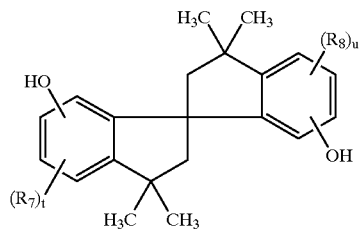
(III)

wherein $R_3$, $R_4$, $R_5$, $R_6$, $R_7$, and $R_8$ may be the same or different and independently represent an alkyl group, an alkoxyl group, a nitro group or a halogen atom, p and q are independently 0 or an integer of 1 to 3, r and s are independently 0 or an integer of 1 to 4, and t and u are independently 0, 1 or 2.

2. A radiation sensitive resist composition according to claim 1, wherein the polymer contains a polymer having recurring unit represented by the following general formula (IV) and/or (V):

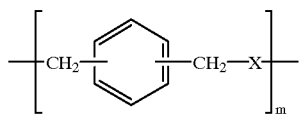
(IV)

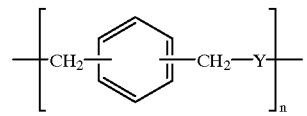
(V)

wherin X represents group;

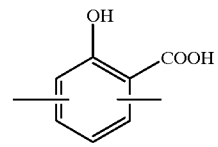
(1)

Y represents group;

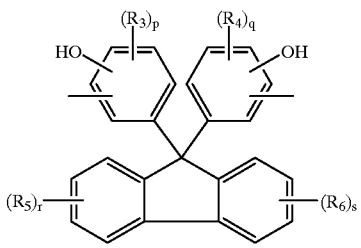
(2)

or group;

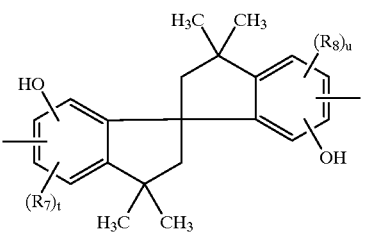
(3)

wherein $R_3$, $R_4$, $R_5$, $R_6$, $R_7$ and $R_8$ may be the same or different and independently represent an alkyl group, an alkoxyl group, a nitro group or a halogen atom, m and n are independently an integer of 1 or more, p and q are independently 0 or an integer of 1 to 3, r and s are independently 0 or an integer of 1 to 4, and t and u are independently 0, 1 or 2.

3. A radiation sensitive resist composition according to claim 1, wherein molar ratio of salicylic acid to a dihydroxy compound in the polymer is 60/40 to 98/2.

4. A radiation sensitive resist composition according to claim 1, wherein the resist material is a positive-working resist comprising an alkali-soluble resin and a quinonediazide photo-sensitizer.

5. A radiation sensitive resist composition according to claim 4, wherein the alkali-soluble resin is novolak resin.

6. A radiation sensitive resist composition according to claims 1, wherein the ratio of the polymer to 100 parts by weight of solid component of radiation-sensitive resist is 0.1 to 40 parts by weight.

* * * * *